United States Patent [19]

Miyauchi

[11] Patent Number: 5,043,004
[45] Date of Patent: Aug. 27, 1991

[54] METHOD FOR MAKING A CERAMIC LID FOR HERMETIC SEALING OF AN EPROM CIRCUIT

[75] Inventor: Nobuaki Miyauchi, San Diego, Calif.
[73] Assignee: Kyocera America, Inc., San Diego, Calif.
[21] Appl. No.: 574,668
[22] Filed: Aug. 29, 1990
[51] Int. Cl.⁵ ............................................. C03Z 29/00
[52] U.S. Cl. ...................... 65/32.2; 65/26; 65/36; 357/29; 357/74; 357/80; 437/19; 437/218
[58] Field of Search ....................... 65/32.2, 36, 26, 39; 357/29, 73, 74, 80; 437/218, 19

[56] References Cited

U.S. PATENT DOCUMENTS

| | | | |
|---|---|---|---|
| 3,069,876 | 12/1962 | Certa et al. | 65/32.2 |
| 3,768,991 | 10/1973 | Rogers | 65/36 |
| 4,100,675 | 7/1978 | Landsittel | 437/218 X |
| 4,291,815 | 9/1981 | Gordon et al. | 437/218 X |
| 4,312,117 | 1/1982 | Robillard et al. | 437/218 X |
| 4,326,214 | 4/1982 | Trueblood | 357/74 |

Primary Examiner—Robert L. Lindsay
Attorney, Agent, or Firm—Spensley Horn Jubas & Lubitz

[57] ABSTRACT

An assembly structure and a method for making a ceramic lid for a hermetically sealed package for an EPROM circuit are disclosed. The assembly structure includes, in combination, a ceramic lid, a UV transparent lens, and two fixtures for supporting the lens in the lid. The two fixtures are configured to contact the lens only at predetermined areas which are not crucial to UV transparency. The UV transparent lens is hermetically sealed to the ceramic lid by firing the assembly structure. The assembly structure prevents the lens from attracting foreign particulate matter during firing, thereby leaving the surfaces of the lens clean. The method provides a ceramic lid having a UV transparent lens hermetically sealed thereto, which finds wide use in integrated circuit packages for high-density EPROM's because of the untainted surfaces of the lens.

14 Claims, 1 Drawing Sheet

METHOD FOR MAKING A CERAMIC LID FOR HERMETIC SEALING OF AN EPROM CIRCUIT

BACKGROUND OF THE INVENTION

1. Field of the Invention

This invention relates generally to the structure and method for making a ceramic lid suitable for use in packaging an erasable programmable read only memory (EPROM) device, and more particularly, to a ceramic lid including an ultraviolet light (UV) transparent lens hermetically sealed thereto, the surfaces of which are substantially free from foreign particulate matter.

2. Related Art

An EPROM circuit is a memory device wherein the memory storage circuits are erasable by irradiation (for example, by UV), and the memory storage circuits can be reprogrammed electrically. EPROM devices must be hermetically sealed in order to be protected from damage and to insure reliability. However, they must also be accessible for irradiation. Thus, EPROM circuits are normally placed within a hermetically sealed protective package that includes a ceramic lid with a UV transparent lens. The UV transparent lens allows the EPROM circuit to be exposed to incoming UV light. EPROM chips within such protective packages are connected to other electronic circuits outside the packages. One such EPROM package is disclosed in U.S. Pat. No. 4,326,214 to R. K. Trueblood. Another type of the EPROM package is shown in U.S. Pat. No. 4,727,221 to Saitou and Bessho, which is concerned with an EPROM device having a shading cover adhered onto a UV window.

Referring to FIGS. 1 and 2, it has been a common practice to hermetically seal a UV transparent lens 10 to a ceramic lid 12 by placing the lens 10 within a preformed aperture 14 of the lid 12 and sandwiching the lid 12 and the lens 10 between paired fixtures 16, 18. The fixtures 16, 18 are each configured to contact the lens 10 and the lid 12 as shown in FIG. 2. An assembly structure 20 results when the fixtures 16, 18, a lens 10, and a lid 12 are fitted together. Upon firing the assembly structure 20, a hermetic seal forms between the lens 10 and the lid 12.

The fixtures 16, 18 are generally made of carbon or graphite because of basic non-wetting nature with respect to glass, which is often the material of the lens. However, such glass materials are so reactive at high temperatures that they attack both carbon and graphite fixtures, which then tend to disintegrate, flake, or chip. As a result, after firing, there is a considerable amount of foreign particles (principally carbon) deposited on the lens. Also, the surfaces of the lens may be damaged. This particle deposition severely impairs the ability of the lens to pass the UV without diffusing it. Therefore, the foreign particles must be removed before the lid 12 and the lens 10 can be used in a semiconductor package. Typically, an alkaline solution is used to clean the lens. However, some of the foreign particles embed in the surface of the lens, and therefore, the alkaline solution cleaning alone does not give satisfactory results; nor can it smooth the surface. On the contrary, the alkaline solution treatment (e.g., boiling a lens in an alkaline solution) roughens the surface of the lens. An additional lens processing step is thus needed. This is normally done by firing the lens again to fire-polish its surface. Although the surface of the lens may be smoothed, the firing does not further eliminate the remaining particles from the lens. This significant level of impurities in an otherwise UV transparent lens is a serious problem where high performance EPROM devices are required.

Accordingly, as the semiconductor industry moves forward to manufacturing more highly integrated EPROM devices, there is an ever-increasing need to minimize or eliminate the noted impurity problems and to provide a ceramic lid having a high grade UV transparent lens suitable for use in a high-density EPROM package.

SUMMARY OF THE INVENTION

It is the prime object of this invention to provide a ceramic integrated circuit package lid having a UV transparent lens, the surfaces of which are substantially free from foreign particulate matter, and which avoid the defects of a UV transparent lens produced and processed by conventional techniques.

It is another object of this invention to provide an assembly structure and a method for making a ceramic lid having a hermetically sealed UV transparent lens, the surfaces of which are substantially free from foreign particulate matter.

In accordance with this invention, there is provided an assembly structure for making a ceramic lid for an EPROM package. The assembly includes, in combination, a ceramic lid, a UV transparent lens, and two fixtures. Each fixture has a cavity and a peripheral region surrounding the cavity that defines a contact area. The contact areas of the fixtures may be coated with a film that will not wet the lens at a high temperature. One fixture is positioned on the ceramic lid such that the cavity encloses the lens and the contact area contacts a predetermined surface region of the lens as well as of the ceramic lid, while the other fixture supports the ceramic lid in like manner. The assembly structure is ready for firing to hermetically seal the lens to the lid.

In accordance with this invention, there is also provided a method for making a ceramic lid for an EPROM package by firing the above assembly structure in an inert atmosphere. The method includes the steps of constructing the assembly structure, firing the lens to the lid, and dismantling the fixtures from the fired ceramic lid. The method may be further accompanied by a step of cleaning a fired and sealed lens with an alkaline solution. The lens thus produced has smooth and clean surfaces, which are substantially free from foreign particulate matter.

These and other objects will become more apparent from the following description and drawings.

DETAILED DESCRIPTION OF THE INVENTION

Figure 1:
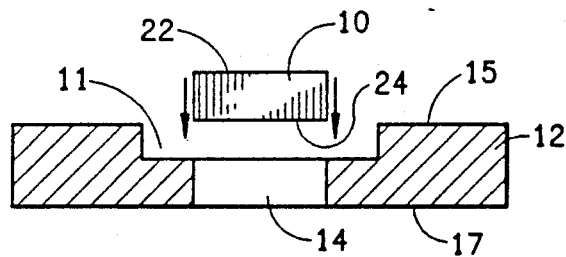
FIG. 1 is a sectional view showing a manner in which a UV transparent lens is inserted into a ceramic lid.

A ceramic lid 12, as shown in FIG. 1, is provided with a preformed aperture 14 at its center, the size of which is adapted to receive a UV transparent lens 10. The lens 10 has a first surface 22 and a second surface 24. The lid 12 has a corresponding first surface 15 and a second surface 17. The aperture 14 may be a part of a depression 11 formed in the lid 12. The lid 12 is a ceramic material such as one of the oxides of aluminum, beryllium, and/or magnesium which are conveniently employed in the semiconductor industry. The lens 10 can be of any material that will pass UV and will have a suitable coefficient of thermal expansion, such as quartz glass or alumina borosilicate. The coefficient of thermal expansion of the lens 10 would ideally match that of the lid 12. The lens 10 is placed within the aperture 14 so as to be in registration therewith.

Figure 3:
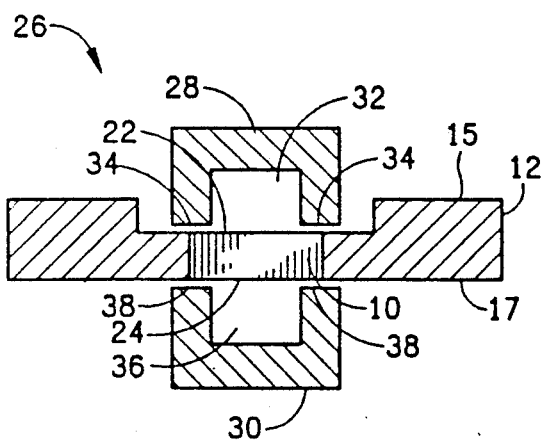
FIG. 3 is a sectional view of an assembly structure according to one embodiment of this invention.

Turning now to FIG. 3, a preferred embodiment of the assembly structure 26 of this invention is illustrated and comprises the lens 10, the lid 12, and a pair of fixtures 28, 30. The first fixture 28 has a cavity 32 and a peripheral region surrounding the cavity 32 that defines a contact area 34. Similarly, the second fixture 30 has a cavity 36 and a peripheral region surrounding the cavity 36 that defines a contact area 38. The cavities 32, 36 can be of any configuration corresponding to the peripheral area of the lens 10, but are usually cylindrical in shape.

Both fixtures 28, 30 can be made of any material as long as the material will maintain its structural integrity and will not seriously wet the material of the lens 10 during firing. Metallic or ceramic materials are preferred, although carbon and graphite are both usable but less preferred. The fixtures 28, 30 can be the same or different in dimension. Likewise, the cavities 32, 36 can be the same or different in dimension.

Figure 4:
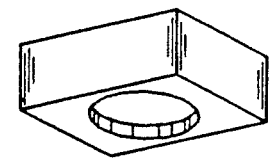
FIG. 4 is a perspective view of a fixture to be used in this invention.
Figure 5:
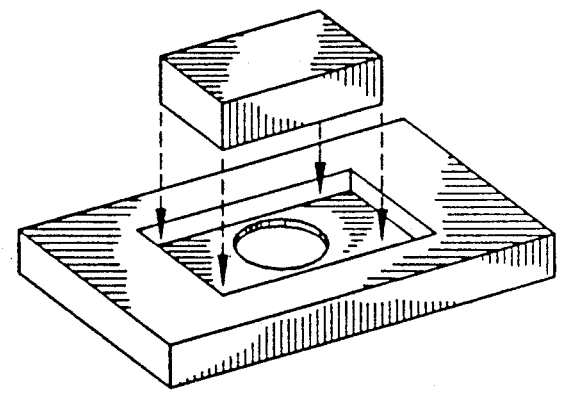
FIG. 5 is a perspective view showing a manner in which a fixture is fitted with a ceramic lid to construct an assembly structure of this invention.

FIG. 4 shows a preferred embodiment of the fixtures 28, 30. Referring to one embodiment shown in FIG. 5, a first fixture 28 is mounted in a depressed area 11 of the lid 12. The resulting configuration is that the cavity 32 of the first fixture 28 substantially encloses the first surface 22 of the lens 10, and the contact area 34 is in contact with both the first lens surface 22 and the first lid surface 15 around their interfacing peripheries, as shown in FIG. 3. The second fixture 30 is placed underneath the lid 12 so as to support the lid 12 and the lens 10 disposed therein. The cavity 36 of the second fixture 30 substantially encloses the second surface 24 of the lens 10, and the contact area 38 is in contact with both the second lens surface 24 and the second lid surface 17 around their interfacing peripheries. Preferably, the fixtures 28, 30 afford substantially air-tight seals between their respective contact areas 34, 38 and surfaces of the lens 10 and the lid 12. Thus, the assembly structure 26 is constructed from its structural components.

In the assembly structure 26, contact may preferably be made between the contact area 34 and the first lens surface 22 at a peripheral region of the first lens surface 22 occupying no more than about 15% of the total area of the first lens surface 22. More preferably, the contact area 34 contacts from about 7% to about 11% of the total lens area. Likewise, the contact area 38 contacts no more than, preferably, about 15% of the total area of the second lens surface 24, and more preferably, contacts between about 7% to about 11% of the total lens area. The peripheral regions on the lens 10 to be contacted by the fixtures are considered noncritical because they do not significantly contribute to passing UV. Therefore, even if these peripheral regions are contaminated by foreign particles as a result of contact with the fixtures 28, 30, such contamination will not have a notable effect on the overall transparency of the lens to UV.

Figure 2:
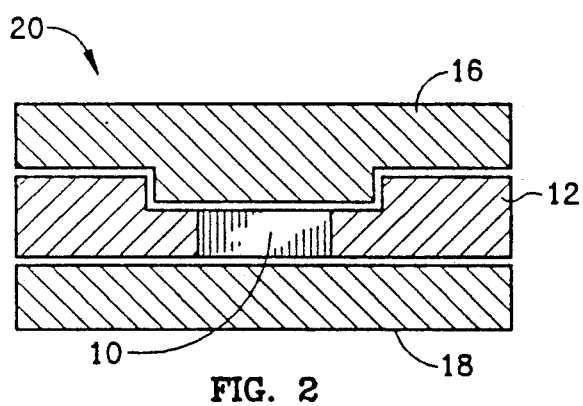
FIG. 2 is a sectional view of a prior art assembly structure.

Because of the cavities 32, 36, the central regions of the fixtures 28, 30 will not come into contact with the critical central areas of the lens 10 through which most of the UV is transmitted. The structure of the fixtures 28, 30 thus prevent foreign particulate matter from being deposited on the critical areas of the lens 10. In contrast, the prior art assembly structure as shown in FIG. 2 requires its fixtures to contact the critical area of the lens, which results in deposition of foreign particulate matter thereon.

In another embodiment, the contact areas 34, 38 may be coated with a film (not shown in FIG. 3). The film can be formed from any material that will keep the contact areas 34, 38 clean and will not wet the lens 10 at a high temperature. Suitable substances which can be used include carbon (which is preferred), boron nitride, silicon carbide, and silicon nitride. The carbon may be applied to the contact areas 34, 38 by a variety of methods known in the art, e.g., by spraying a colloidal carbon solution. Other exemplary techniques are chemical vapor deposition method and sputtering where the coating material is deposited on a fixture substrate from a source. Such coatings can completely prevent the contact areas 34, 38 from wetting the lens 10 and, thus, offers an additional advantage.

After the assembly structure 26 is constructed with all components in place, as shown in FIG. 3, it is fired in an inert atmosphere at a high temperature sufficient to thereby partially melt the lens 10 causing it to hermetically fuse to the lid 12. The firing temperature is typically at least about 800° C. Although firing can be done in air, it is preferably carried out under a non-oxidizing inert atmosphere such as nitrogen or hydrogen. After firing, the fixtures 28, 30 are disengaged from the lid 12 and the lens 10. The resultant lens 10 proves to have surfaces 22, 24 which are substantially free from foreign particulate matter. If desired, the surfaces 22, 24 of the lens may be further cleaned by any conventional technique (e.g., with an alkaline cleaning solution).

Figure 6:
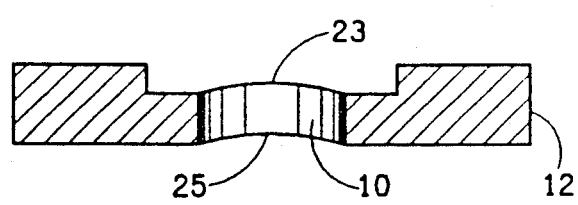
FIG. 6 is a sectional view of a finished ceramic lid obtained according to one embodiment of this invention.

In one embodiment of the method of this invention, the volume of the cavity 32 of the first fixture 28 is set to be smaller than the volume of the cavity 36 of the second fixture 30. As stated earlier, the cavities 32, 36 can be airtight. When the firing operation is carried out according to the above procedure, air or an entrapped inert gas expands within the cavities 32, 36. Since the volume of the cavity 32 is smaller than the volume of the cavity 36, the first surface 22 of the lens 10 is subjected to a lesser pressure as a result of gas expansion than the second surface 24 of the lens 10. This brings about a concave first face 23 and a convex second face 25, as shown in FIG. 6. If the cavities 32, 36 are substantially of the same volume, the lens 10 will have planar faces. Thus, the fixtures 28, 30 can control the shape of the lens 10 by varying the volume of their respective cavities 32, 36. Alternatively, the planar faces can be converted to a concave first face and a convex second face. This, however, requires an additional firing step. Thus, the lid 12 with planar faces is fired in an inverted manner where the first surface 22 faces downward and the second surface 24 faces upward, respectively. Upon firing, the concave first face 23 and the convex second face 25 result by virtue of gravity. A convex second surface 25 is preferred because the shape of the second surface 25 prevents the lens 10 from damage (e.g., scratches) while the lid 12 is being carried on a conveyor for further processing.

By using the method and the assembly structure according to this invention for making a ceramic the lid, a second firing of a fired lid to fire-polish the lens surfaces is avoided. Furthermore, this invention insures that the lens of a fired lid is substantially free from foreign particulate matter. The final lid produced with such an untainted lens is particularly suited for use in a package for high-density EPROM integrated circuits.

Although this invention has been described by way of several embodiments thereof, it should be realized that many alternatives, modifications, and variations will be apparent to those skilled in the art of the foregoing description. Accordingly, it is intended to embrace all such alternatives, modifications, and all variations as falling within the spirit and broad scope of the appended claims.

I claim:

1. A method for making a ceramic lid for an erasable programmable read only memory package, the ceramic lid including a hermetically sealed ultraviolet transparent lens, the surfaces of which are substantially free from foreign particulate matter, wherein the method comprises the steps of:

providing a ceramic lid having an aperture formed therein, the ceramic lid having a first surface and a second surface;

positioning an ultraviolet transparent lens within the aperture of the ceramic lid, the lens having a first surface and a second surface;

placing on the first surface of the ceramic lid a first fixture having a cavity and a peripheral region surrounding the cavity and further defining a contact area, such that the cavity of the first fixture substantially encloses the first surface of the lens and the contact area contacts the first surface of the lens substantially only around the periphery of the lens; and supporting the ceramic lid from its second surface with a second fixture having a cavity and a peripheral region surrounding the cavity and further defining a contact area, such that the cavity of the second fixture substantially encloses the second surface of the lens and the contact area contacts the second surface of the lens substantially only around the periphery of the lens to thereby form an assembly structure comprising the ceramic lid, the lens, and the first and the second fixtures;

firing the assembly structure in an inert atmosphere at a high temperature sufficient to hermetically seal the lens to the ceramic lid; and disengaging the first and the second fixtures from the assembly structure, whereby the finished surfaces of the lens remain substantially free from foreign matter.

2. The method according to claim 1, wherein the first and the second fixtures are made of a metallic material or a ceramic material.

3. The method according to claim 1, wherein the inert atmosphere is nitrogen or hydrogen.

4. The method according to claim 1, further comprising treating the finished surfaces of the lens with an alkaline cleaning solution.

5. The method according to claim 1, wherein the contact area of the first fixture contacts up to about 15% of the total area of the first surface of the lens and the contact area of the second fixture contacts up to about 15% of the total area of the second surface of the lens.

6. The method according to claim 5, wherein the contact area of the first fixture contacts from about 7% to about 11% of the total area of the first surface of the lens and the contact area of the second fixture contacts from about 7% to about 11% of the total area of the second surface of the lens.

7. The method according to claim 6, wherein the cavity of the first fixture is substantially the same volume as the cavity of the second fixture.

8. The method according to claim 7, wherein both of the finished surfaces of the lens are flat.

9. The method according to claim 6, wherein the cavity of the first fixture is of a different volume from the cavity of the second fixture.

10. The method according to claim 9, wherein the cavity of the first fixture is smaller in volume than the cavity of the second fixture.

11. The method according to claim 10, wherein the first finished surface of the lens is concave and the second finished surface of the lens is convex.

12. The method according to claim 11, wherein the contacting area of the first fixture and the contacting area of the second fixture are coated with a film that does not wet the lens during firing.

13. The method according to claim 12, wherein the thin film is formed from a substance selected from the group consisting of carbon, boron nitride, silicon nitride, and silicon carbide.

14. The method according to claim 13, wherein the substance is carbon.

* * * * *